(12) United States Patent
Choi et al.

(10) Patent No.: US 7,397,079 B2
(45) Date of Patent: Jul. 8, 2008

(54) NON-VOLATILE MEMORY DEVICE AND METHODS OF FORMING THE SAME

(75) Inventors: Yong-Suk Choi, Seoul (KR);
Seung-Beom Yoon, Suwon-si (KR);
Yong-Tae Kim, Yonging-si (KR);
Jin-Woo Kim, Suwon-si (KR)

(73) Assignee: Samsung Electronics, Co., Ltd., Suwon-Si (KR)

( * ) Notice: Subject to any disclaimer, the term of this patent is extended or adjusted under 35 U.S.C. 154(b) by 431 days.

(21) Appl. No.: 11/245,527

(22) Filed: Oct. 7, 2005

(65) Prior Publication Data
US 2006/0079054 A1 Apr. 13, 2006

(30) Foreign Application Priority Data
Oct. 8, 2004 (KR) ............... 10-2004-0080524

(51) Int. Cl.
*H01L 29/76* (2006.01)
*H01L 29/788* (2006.01)
*H01L 21/8238* (2006.01)

(52) U.S. Cl. ............... 257/314; 257/315; 257/E29.129; 257/E29.3; 257/E21.179; 257/E21.68; 438/201; 438/257

(58) Field of Classification Search ......... 257/314–317, 257/321, 324, 29.129, E29.3, E21.179, E21.422, 257/E21.68; 438/201, 211, 257
See application file for complete search history.

(56) References Cited

U.S. PATENT DOCUMENTS 5,455,793 A 10/1995 Amin et al. ............ 365/185.26
7,276,759 B1 * 10/2007 Yu et al. ..................... 257/317

FOREIGN PATENT DOCUMENTS

JP 09-064208 3/1997
KR 10-0390889 7/2003
KR 10-2004-0049874 6/2004

* cited by examiner

*Primary Examiner*—Hoai V Pham
(74) *Attorney, Agent, or Firm*—F. Chau & Associates, LLC.

(57) ABSTRACT

A non-volatile memory device includes a control gate electrode disposed on a substrate with a first insulation layer interposed therebetween and a floating gate disposed in a hole exposing substrate through the control gate electrode and the first insulation layer. A second insulation layer is interposed between the floating gate and the substrate, and between the floating gate and the control gate.

20 Claims, 9 Drawing Sheets

Fig. 1

(PRIOR ART)

Fig. 2

(PRIOR ART)

Fig. 3

(PRIOR ART)

NON-VOLATILE MEMORY DEVICE AND METHODS OF FORMING THE SAME

CROSS-REFERENCE TO RELATED APPLICATIONS

This application claims priority under 35 U.S.C. § 119 to Korean Patent Application No. 2004-80524 filed on Oct. 8, 2004, the entire contents of which are hereby incorporated by reference.

BACKGROUND OF THE INVENTION

The present invention relates to semiconductor devices and to methods of forming the same and, more particularly, to a non-volatile memory device and methods of forming the same.

Non-volatile memory devices continuously hold their stored data even when their power supplies are interrupted. Representative non-volatile memory devices include flash memory devices. For example, a typical flash memory device includes a floating gate and a control gate electrode. As charges are injected/discharged to/from the floating gate, a flash memory device stores data of logic "1" or "0".

For instance, a split-gate type flash memory device is disclosed in U.S. Pat. No. 5,045,488. This patent purports to disclose a floating gate formed using a thermal oxide to have a curved-up top surface, thereby resulting in a peak being formed on the floating gate. Conventional flash memory devices, such as those discussed in U.S. Pat. No. 5,045,488 will now be described with reference to FIG. 1 through FIG. 3.

Figure 1:
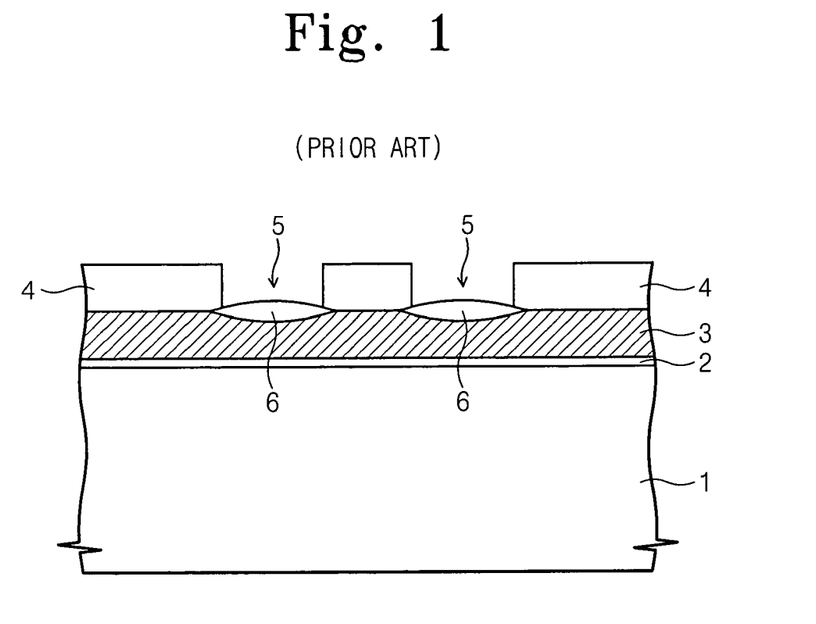
FIG. 1 through FIG. 3 are cross-sectional views of a conventional split-gate type flash memory device.

As illustrated in FIG. 1, a gate oxide layer 2, a polysilicon layer 3, and a silicon nitride layer 4 are sequentially formed on a semiconductor substrate 1. The silicon nitride layer 4 is patterned to form an opening 5 exposing a predetermined region of the polysilicon layer 3. A pair of openings 5 are symmetrically formed at the silicon nitride layer 4.

The substrate 1 is thermally oxidized to form a thermal oxide layer 6 on the exposed polysilicon layer 3. Since a bird's beak is formed at the edge of the thermal oxide layer 6, the thermal oxide layer 6 becomes thinner toward its edge from its center. The bird's beak extends downwardly toward the silicon nitride layer 4 consisting of a sidewall of the opening 5.

Figure 2:
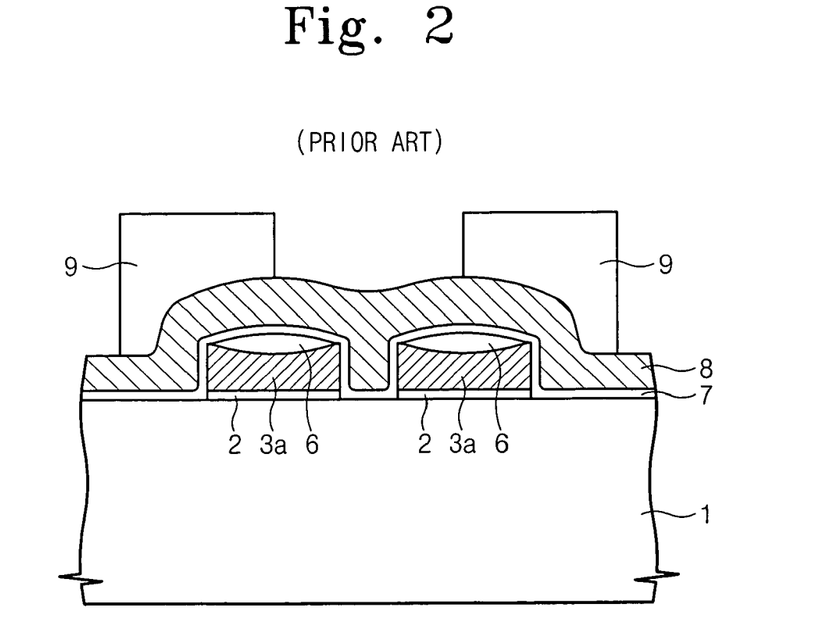

As illustrated in FIG. 2, the silicon nitride layer 4 is removed. Using the thermal oxide layer 6 as a mask, the polysilicon layer 3 and the gate oxide layer 2 are etched anisotropically successively to form a pair of floating gates 3a disposed symmetrically. A peak is formed on the edge of the floating gate 3a due to the thermal oxide layer 6.

An intergate oxide layer 7 and a control gate conductive layer 8 are sequentially formed on a semiconductor substrate 1 including the floating gate 3a. A pair of photoresist patterns 9 are symmetrically formed on the control gate conductive layer 8. The photoresist patterns 9 cover a portion of the floating gate 3a and a portion of the semiconductor substrate 1 adjacent to the floating gate 3a.

Figure 3:
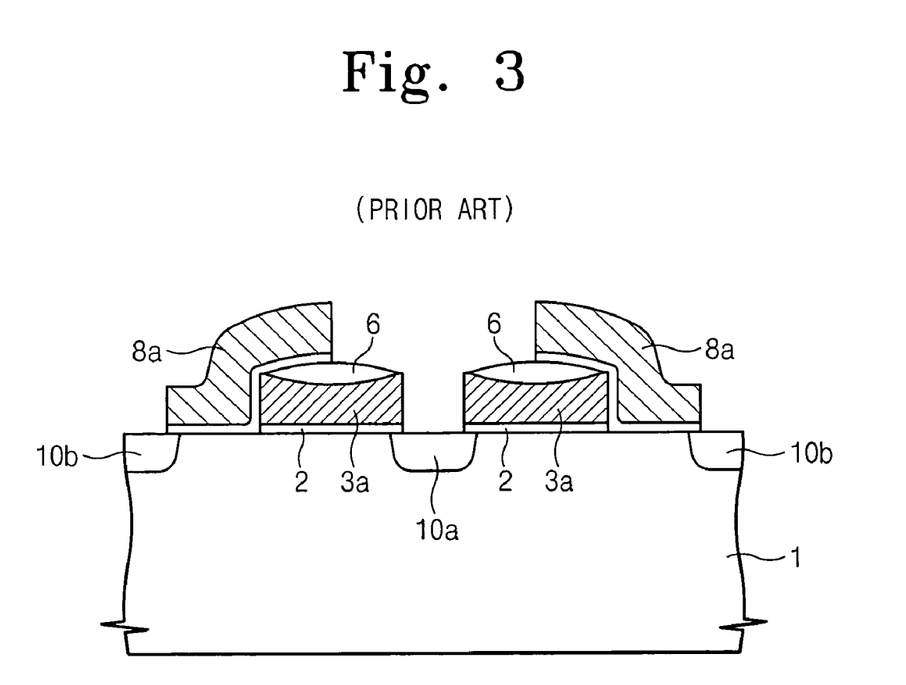

As illustrated in FIG. 3, using the photoresist pattern 9 as a mask, the control gate conductive layer 8 and the intergate oxide layer 7 are anisotropically etched to form a control gate electrode 8a. The control gate electrode 8a covers a peak of the floating gate 3a and a portion of the semiconductor substrate 1 adjacent to one side of the floating gate 3a.

Following removal of the photoresist pattern 9, impurities are selectively implanted to form first and second impurity doping layers. The first impurity doping layer 10a is formed on the semiconductor substrate 1 between the floating gates 3a, and the second impurity doping layer 10b is formed on the semiconductor substrate 1 adjacent to one side of the floating gate 3a opposite to the first impurity doping layer 10a.

In the above-described conventional flash memory device, an electric field is concentrated on the peak of the floating gate 3a to reduce an erase voltage for discharging charges stored in the floating gate 3a to the control gate electrode 8a.

However, in forming conventional flash memory devices, the spaces of openings 5 continue to decrease due to the continuing demand for higher integration density of semiconductor devices. As a result, when floating gates 3a are formed using the thermal oxide layer 6 as a mask, bird's beaks adjacent the thermal oxide layers 6 may penetrate below the silicon nitride layer 4 between the pair of the thermal oxide layers 6 to be interconnected, thereby causing the adjacent floating gates 3a to become interconnected to one another via the thermal oxide layers 6. However, the floating gates 3a must be isolated electrically because otherwise if adjacent floating gates 3a are instead connected to one another, this results in the malfunction of the flash memory device.

Moreover, the thickness of the control gate conductive layer 8 may vary with its formation location due to the floating gate 3a. Particularly, the gap region between the floating gates 3a has become narrower due to the recent trend toward higher integration density of semiconductor devices. Thus, the control gate conductive layer 8 filling a gap region between the floating gates 3a may now become thicker than a control gate conductive layer 8 formed on a planar substrate 1 that is opposite to the gap region. In other words, the control gate conductive layer 8 on the semiconductor substrate 1 where the first impurity doping layer 10a is formed may be thicker than the control gate conductive layer 8 on the semiconductor substrate 1 where the second impurity doping layer 10b is formed. As a result, when an etch process is performed to form the control gate electrode 8a, a surface of the semiconductor substrate 1 where the second impurity doping layer 10b is formed may be more severely damaged than a surface of the semiconductor substrate 1 where the first impurity doping layer 10a is formed. Also, a surface of the semiconductor substrate 1 adjacent to opposite sides of a gate electrode of a peripheral circuit transistor formed in a peripheral circuit using the control gate conductive layer 8 may be damaged severely. Due to surface damage to the substrate 1, a surface of the second impurity doping layer 10b and/or surfaces of source/drain regions may become rough and their junction depth may decrease. Moreover, the above described damage also results in the generation of a leakage current.

SUMMARY OF THE INVENTION

Exemplary embodiments of the present invention are directed to a non-volatile memory device and methods of forming the same. In an exemplary embodiment, the non-volatile memory device includes a control gate electrode disposed on a substrate with a first insulation layer interposed therebetween; a floating gate disposed in a hole exposing the substrate through the control gate electrode and the first insulation layer; and a second insulation layer interposed between the floating gate and the substrate and between the floating gate and the control gate.

In another exemplary embodiment, the method includes sequentially forming a first insulation layer and a control gate conductive layer on a substrate; forming a hole to expose a predetermined region of the substrate through the control gate conductive layer and the first insulation layer; forming a floating gate with a second insulation layer interposed therebetween to fill the hole; and patterning the control gate conductive layer to form a control gate electrode including the floating gate.

BRIEF DESCRIPTION OF THE DRAWINGS

FIG. 5A through FIG. 10A are plan views illustrating a method of forming a non-volatile memory device in accordance with an exemplary embodiment of the present invention.

FIG. 5B through FIG. 10B are cross-sectional view taken along a line II-II' of FIG. 5A through FIG. 10A, respectively.

DETAILED DESCRIPTION OF PREFERRED EMBODIMENTS

The exemplary embodiments of the present invention will now be described more fully hereinafter with reference to the accompanying drawings, in which preferred embodiments of the invention are shown. This invention may, however, be embodied in different forms and should not be construed as limited to the embodiments set forth herein. In the drawings, the thickness of layers and regions are exaggerated for clarity. It will also be understood that when a layer is referred to as being "on" another layer or substrate, it can be directly on the other layer or substrate, or intervening layers may also be present.

Figure 4A:
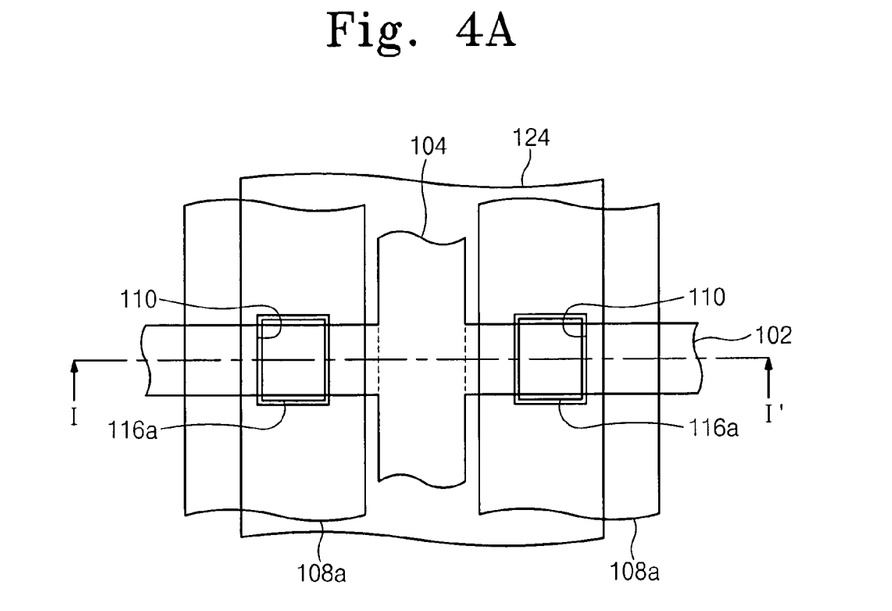
FIG. 4A is a top plan view of a non-volatile memory device in accordance with an exemplary embodiment of the present invention.
Figure 4B:
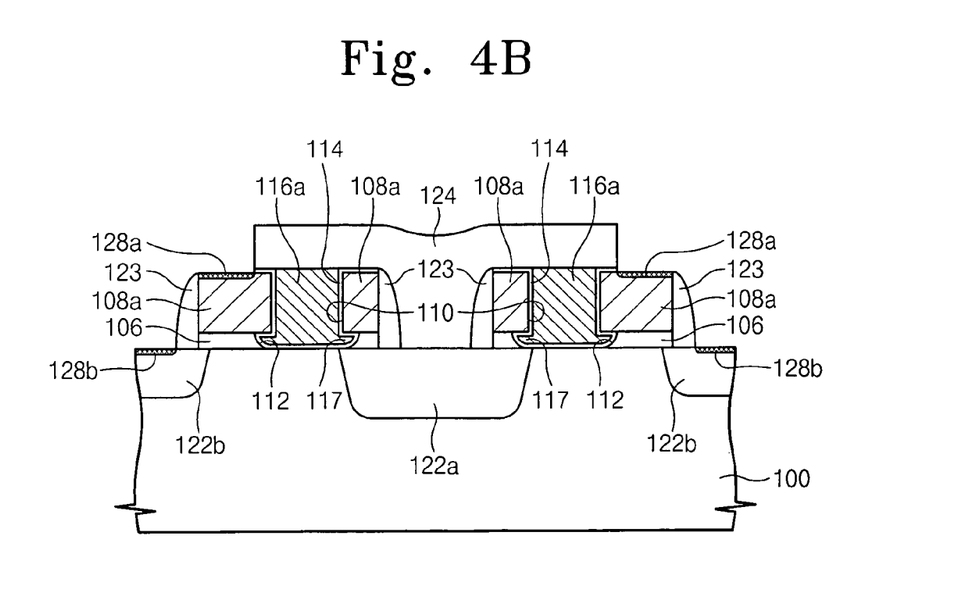
FIG. 4B is a cross-sectional taken along a line I-I' of FIG. 4A.

FIG. 4A is a plan view of a non-volatile memory device according to an embodiment of the present invention, and FIG. 4B is a cross-sectional view taken along a line I-I' of FIG. 4A.

As illustrated in FIG. 4A and FIG. 4B, a device isolation layer is disposed to define a first and a second active regions 102 and 104 on a semiconductor substrate 100 (hereinafter briefly referred to as "substrate"). The first active region 102 extends linearly in a row direction, and the second active region 104 crosses the first active region 102 in a column direction.

A pair of control gate electrodes 108a cross over the first active region 102 side by side, and the second active region 104 is interposed between the pair of control gate electrodes 108a. The second active region 104 is parallel with the control gate electrodes 108a. A first insulation layer 106 is interposed between the control gate electrode 108a and the first active region 102.

A floating gate 116a is disposed in a hole 110 exposing the first active region 102 through the control gate electrode 108a and the first insulation layer 106. A second insulation layer 114 is interposed between the floating gate 116a and the first active region 102 and between the floating gate 116a and the control gate electrode 108a. The floating gate 116a fills the hole 110 with the second insulation layer 114 interposed therebetween. The hole 110 may be formed to expose a portion of the device isolation layer at opposite sides of the first active region 102. For this reason, the floating gate 116a may overlap a portion of the device isolation layer at opposite sides of the first active region 102. Although the hole 110 is rectangular in FIG. 4A, it is not limited to any particular shape, but rather the hole 110 may also be, for example, circular, elliptical or polygonal.

A first impurity doping layer 122a is disposed at the first active region 102 at one side of the control gate electrode 108a, and a second impurity doping layer 122b is disposed at the first active region 102 at the other side of the control gate electrode 108a that is opposite to the first impurity doping layer 122a. The first impurity doping layer 122a is disposed at the first active region 102 between the pair of the control gate electrodes 108a. The first impurity doping layer 122a corresponds to a common source region. The first impurity doping layer 122a may extend along the second active region 104 to act as a source line. Alternatively, the first impurity doping layer 122a may be connected to an overlying source interconnection line (not shown). In this case, the second active region 104 may be omitted. The second impurity doping layer 122b corresponds to a drain region connected to a bitline (not shown).

The floating gate 116a is adjacent to the first impurity doping layer 122a. Particularly, the floating gate 116a may partially overlap the first impurity doping layer 122a. The floating gate 116a, however, is separated from the second impurity doping layer 122a. A junction of the first impurity doping layer 122a may be deeper than that of the second impurity doping layer 122b. Alternatively, junctions of the first and the second impurity doping layers 122a and 122b have the same depth.

An undercut region 112 is formed at a lower sidewall of the hole 110 consisting of the first insulation layer 106. A lower sidewall of the floating gate 116a extends laterally to fill the undercut region 112. The undercut region 112 is a region where the first insulation layer 106 of the hole 110 is laterally depressed. The first insulation layer 106 constituting a sidewall of the undercut region 112 makes an edge with the control gate electrode 108a adjacent to the hole 110. Thus, a protrusion 117 of the floating gate 116a filling the undercut region 112 includes an angled portion. Particularly, the undercut region 112 is laterally tapered from a lower portion of the hole 110. In other words, the first insulation layer 106 constituting the sidewall of the undercut region 112 may have a curved-up shape. Accordingly, the protrusion 117 of the floating gate 116a may have a laterally tapered shape from a lower sidewall of the floating gate 116a. The second insulation layer 114 is interposed between a bottom of the control gate 108a covering the undercut region 112 and a sharp portion of the floating gate 1116a.

The control gate electrode 108a, the floating gate 116a, and the impurity doping layers 122a and 122b constitute a unit cell of a non-volatile memory device. A pair of non-volatile memory cells, which are symmetrically disposed, are illustrated in FIG. 4A and FIG. 4B.

The first insulation layer 106 may be made of silicon oxide (e.g., thermal oxide). Alternatively, the first insulation layer 106 may be made of silicon oxynitride (e.g., thermal oxynitride). The control gate electrode 108a is made of a conductive material. Preferably, the control gate electrode 108a is made of silicon. For example, the control gate electrode 108a may be made of doped polysilicon or doped amorphous silicon. The second insulation layer 114 may be made of silicon oxide. Preferably, the control gate electrode 108a is made of silicon and the second insulation layer 114 is made of thermal oxide.

The second insulation layer 114 is thinner than the first insulation layer 106. Specifically, the second insulation layer 114 may be thin enough to allow tunneling of charges and the first insulation layer 106 may be thick enough not to allow tunneling of charges. Thus, the second insulation layer 114 interposed between the floating gate 116a and a surface of the first active region 102 may act as a tunnel insulation layer. The floating gate 116a may be made of doped polysilicon or doped amorphous silicon.

A spacer 123 is disposed on both sidewalls of the control gate electrode 108a. The impurity doping layers 122a and 122b may have a low doped drain transistor structure (LDD) or an extended source/drain structure resulting from the spacer 123. The spacer 123 may include a silicon nitride layer. Further, the spacer 123 may include a silicon oxide layer and a silicon nitride layer which are stacked in the order named.

First metal silicide 128a is disposed on a portion of a top surface of the control gate electrode 108a. A resistance of the control gate electrode 108a decreases due to the first metal silicide 128a. The first metal silicide 128a may be made of cobalt silicide, nickel silicide or titanium silicide. A silicidation barrier pattern 124 covers a portion of a top surface of the control gate electrode 108a, on which the first metal silicide is not formed. The silicidation barrier pattern 124 also covers a top surface of the floating gate 116a. Further, the silicidation barrier pattern may extend laterally to cover the first impurity doping layer 122a. The silicidation barrier pattern 124 is made of dielectric to prevent silicidation of polysilicon. The silicidation barrier pattern 124 may be made of, for example, silicon oxide.

Second metal silicide 128b may be disposed on a surface of the second impurity doping layer 122a. The first and the second metal silicides 128a and 128b may include the same metal. For example, as with the first metal silicide 128a mentioned above, the second metal silicide 128b may also be made of cobalt silicide, nickel silicide or titanium silicide.

A method of operating the above-described non-volatile memory cell will now be described. First, a program method for injecting charges into the floating gate 116a is described. A program voltage is applied to the first impurity doping layer 122a, and a reference voltage (e.g., ground voltage) is applied to the control gate voltage 108a. Since a power voltage is applied to the control gate electrode 108a, the charges are injected into the floating gate 116a through the second insulation layer 114 using hot carrier implantation.

Next, an erase method for discharging charges from the floating gate is described. A reference voltage (e.g., ground voltage) is applied to the first and the second impurity doping layers 122a and 122b, and an erase voltage is applied to the control gate electrode 108a. Accordingly, the charges in the floating gate 116a are discharged to the control gate electrode 108a through a second insulation layer 114 between the floating gate 116a and the control gate electrode 108a. An electric field is concentrated on the protrusion 117 of the floating gate 116a including an angled portion. Preferably, the protrusion 117 of the floating gate 116a includes a sharp portion, so that the electric field may be more concentrated. Thus, most charges may be discharged to the control gate electrode 108a through the protrusion 117 of the floating gate 116a. Due to the protrusion 117 of the floating gate 116a, the erase voltage may fall.

The non-volatile memory device according to the invention does not require a thermal oxide layer for a peak of a conventional floating gate, which prevents connection of floating gates resulting from interconnection of adjacent thermal oxide layers.

The floating gate 116a is disposed in a hole 110 penetrating the control gate electrode 108a to prevent a step difference of the control gate electrode resulting from the floating gate 116a. Thus, substrate surface damage resulting from a step difference of a control gate conductive layer may be suppressed to decrease junction depth of the impurity doping layers 122a and 122b and/or prevent a leakage current caused by a surface defect of the impurity doping layers 122a and 122b.

In addition, an electric field is concentrated on the protrusion 117 of the floating gate 116a filling the undercut region 112. Thus, an erase voltage required for discharging the charges in the floating gate 116 to the control gate electrode 108a may be reduced to save power consumption of the non-volatile memory device.

FIG. 5A through FIG. 10A are plan views for explaining a method of forming a non-volatile memory device according to at least one embodiment of the present invention, and FIG. 5B through FIG. 10B are cross-sectional views taken along a line II-II' of FIG. 5A through FIG. 10A, respectively.

Figure 5A:
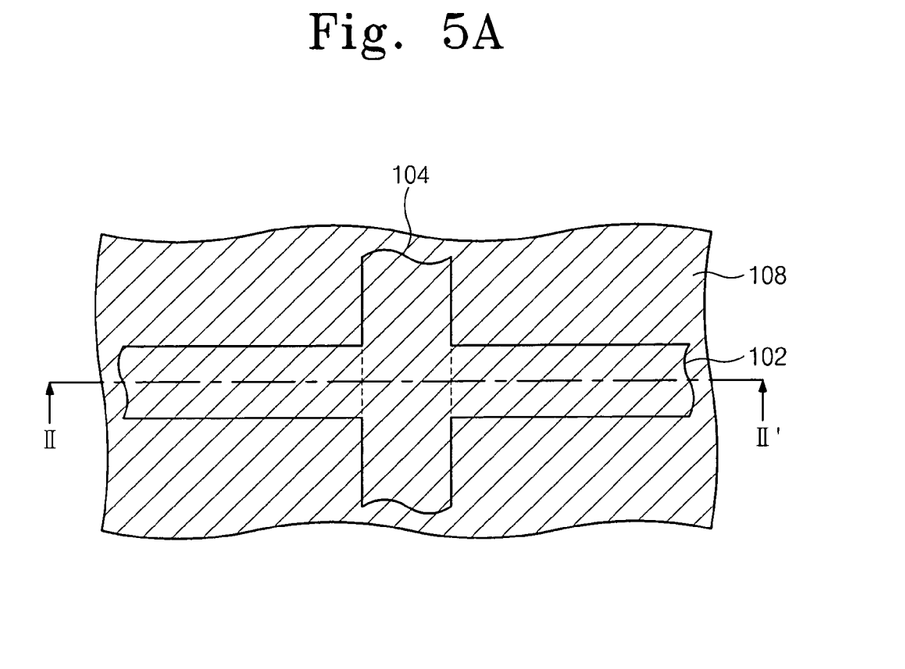
Figure 5B:
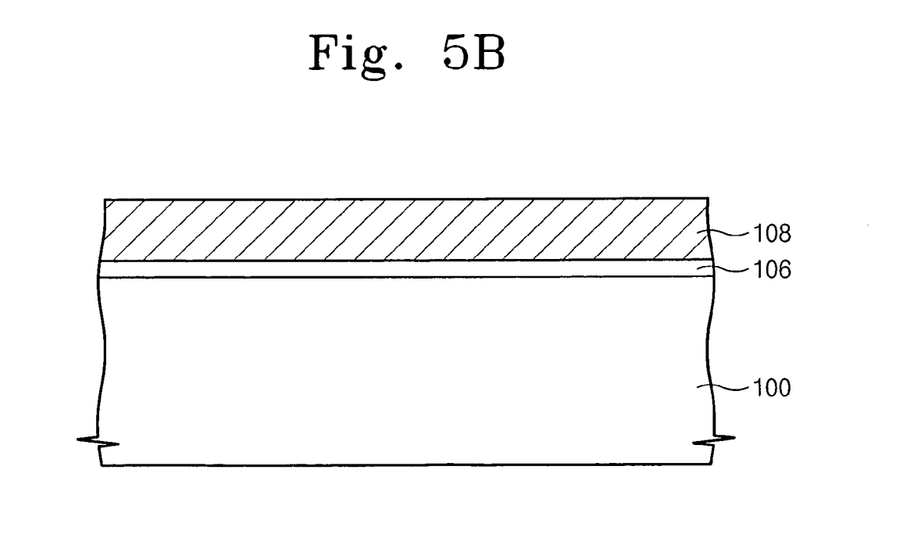

Referring to FIG. 5A and FIG. 5B, a device isolation layer is formed on the substrate 100 to define first and second active regions 102 and 104. The first active region 102 extends linearly in a row direction, and the second active region 104 crosses the first active region 102. In some cases, the second active region 104 may be omitted.

A first insulation layer 106 and a control gate conductive layer 108 are sequentially formed on an entire surface of the substrate 100. The first insulation layer 106 may be made of silicon oxide (e.g., thermal oxide) or silicon oxynitride (e.g., thermal oxynitride). The control gate conductive layer 108 is made of a conductive material. Preferably, the control gate conductive layer 108 is made of silicon. For example, the control gate conductive layer 108 may be made of doped polysilicon or doped amorphous silicon.

Figure 6A:
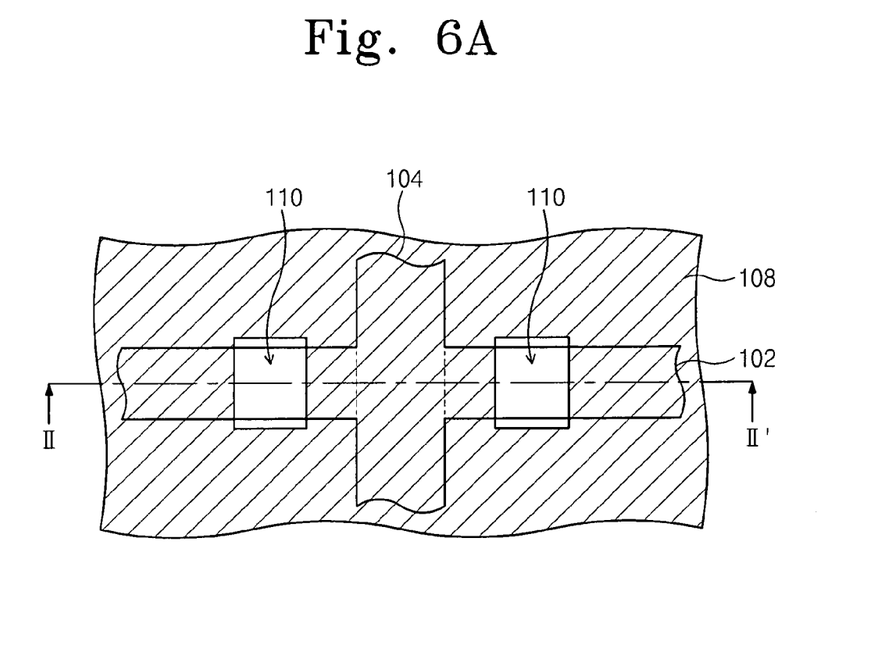
Figure 6B:
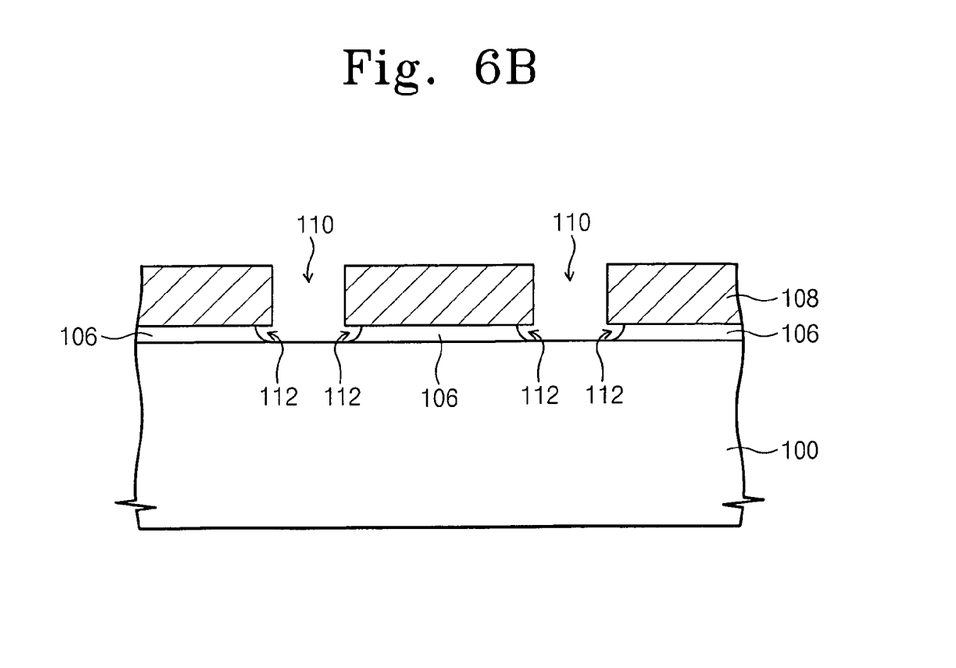

Referring to FIG. 6A and FIG. 6B, a hole 110 is formed to expose a predetermined region of the first active region 102 through the control gate conductive layer 108 and the first insulation layer 106 A pair of the holes 110 are formed at the substrate 100 and spaced apart from each other. The second active region 104 is disposed between the pair of the holes 110.

A method of forming the hole 110 will now be explained in detail. Using an anisotropic etch, the control gate conductive layer 108 is patterned to form the first insulation layer 106. The exposed first insulation layer 106 is isotropically etched to form the hole 110. The first insulation layer 106 is isotropically etched to form an undercut region 112 at a lower sidewall of the hole 110. The undercut region 112 includes a sharp edge made by a bottom surface of the control gate conductive layer 108 adjacent to the hole 110 and the first insulation layer 106 etched isotropically. A sidewall of the isotropically etched first insulation layer 106 is formed to have a curved-up shape. The first insulation layer 106 is isotropically etched, so that the undercut region 112 may have a laterally tapered shape from a lower portion of the hole 110.

Although not shown, formation of the undercut region 112 may be done using different methods. That is, after the control gate conductive layer 108 and the first insulation layer 108 are successively patterned using an anisotropic etch to expose the first active region 102, the anisotropically etched first insulation layer 106 is isotropically etched to form the undercut region 112. In this case, the undercut region 112 may not be tapered. However, the undercut region 112 still has a sharp edge made by a lower surface of the control gate conductive layer 108 adjacent to the hole 110 and the etched first insulation layer 106.

Figure 7A:
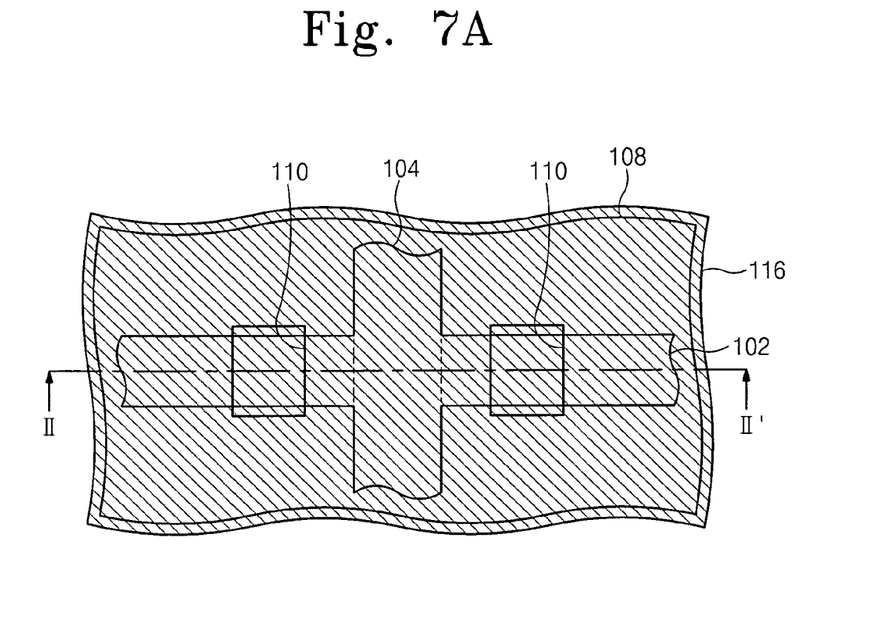
Figure 7B:
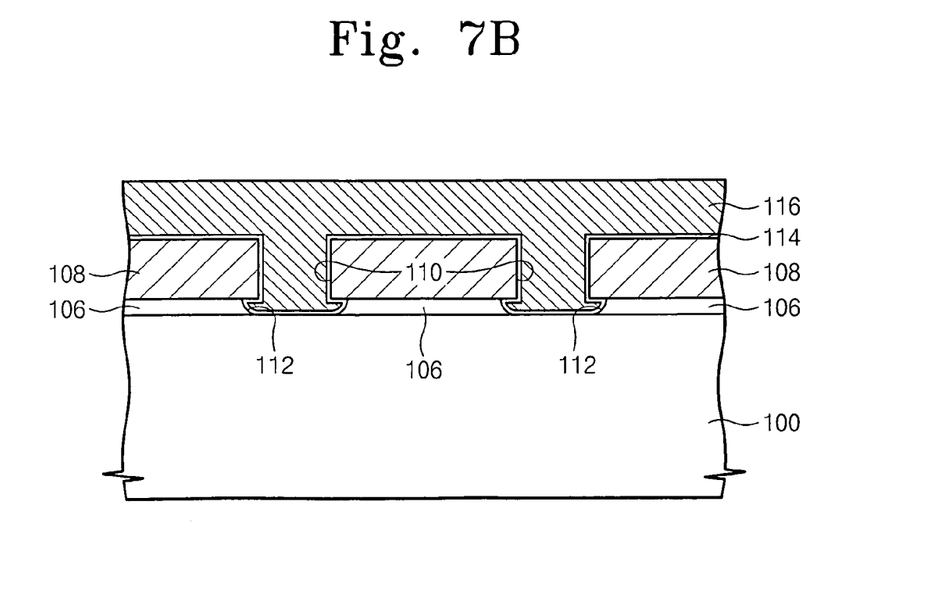

Referring to FIG. 7A and FIG. 7B, a second insulation layer 114 is formed on an entire surface of the substrate 100. When a surfaces of the control gate conductive layer 108 and the exposed first active region 102 are made of silicon, a substrate 100 including the hole 110 is thermally oxidized to form the second insulation layer 114. Accordingly, the second insulation layer 114 may be formed on the surface of the control gate conductive layer 108 and the surface of the exposed first active region 102. The second insulation layer 114 is formed on a top surface of the control gate conductive layer 108, a sidewall of the control gate conductive layer 108 consisting of a sidewall of the hole 110 and a bottom surface of the control gate conductive layer 108 covering the undercut region 112.

Alternatively, the second insulation layer 114 may be made of chemical vapor deposition (CVD) silicon oxide having a superior step coverage. The second insulation layer 114 may further include a CVD insulator as well as silicon oxide.

The second insulation layer 114 is formed to be thinner than the first insulation layer 106. More specifically, the second insulation layer 114 is thin enough to allow a tunneling of charges while the first insulation layer 106 is thick enough not to allow a tunneling of charges. Accordingly, the second insulation layer 114 formed on the first active region 102 may act as a tunnel insulation layer.

A gate layer 116 is formed on an entire surface of a substrate 100 including the second insulation layer 114 to fill the hole 110 and the undercut region 112. The gate layer 116 is made of doped polysilicon or doped amorphous silicon having a superior step coverage.

Figure 8A:
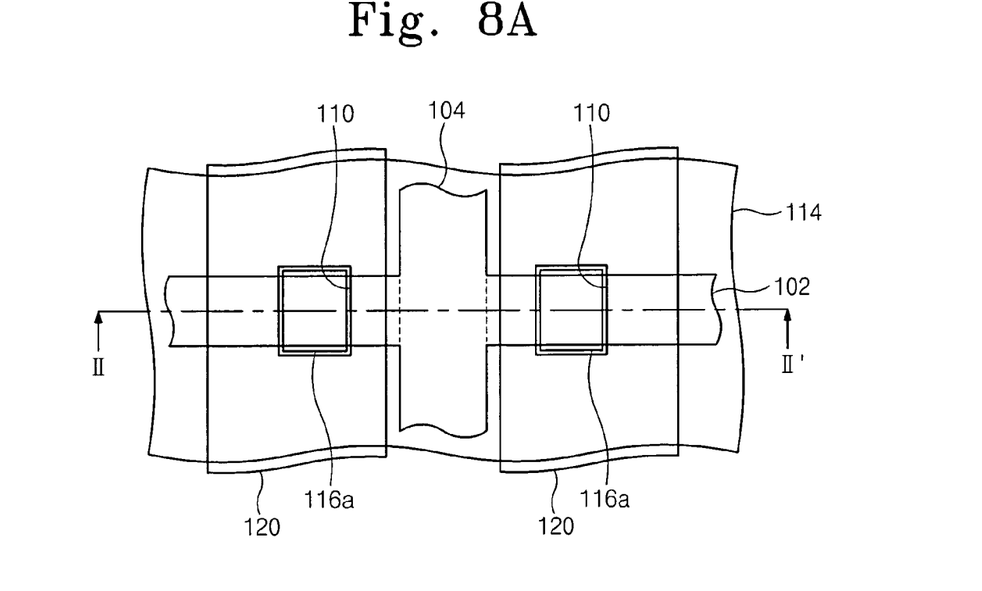
Figure 8B:
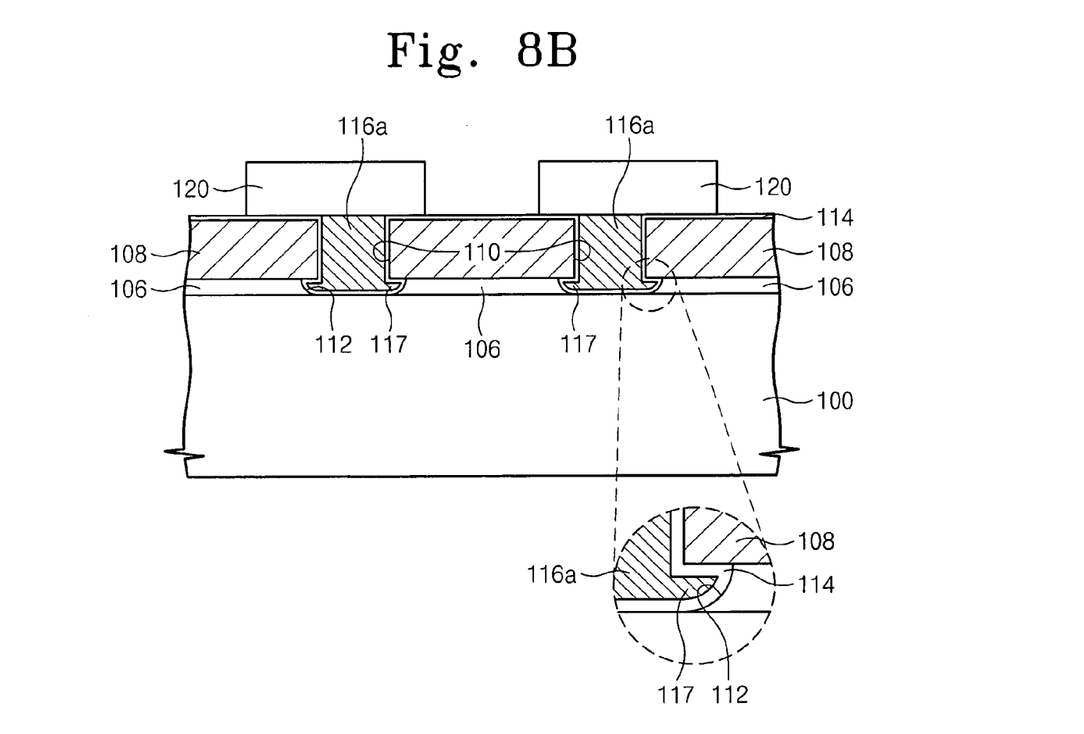

Referring to FIG. 8A and FIG. 8B, the gate layer 116 is planarized down to a top surface of the second insulation layer 114 formed on a top surface of the control gate conductive layer 108 to form a floating gate 116a. Planarization of the gate layer 116 may be done using etchback or chemical mechanical polishing (CMP).

The floating gate 116a is formed to include a protrusion 117 filling the undercut region 112. The protrusion 117 of the floating gate 116a is formed to have an angled portion due to the undercut region 112. Since the undercut region 112 is formed to laterally taper from a lower portion of the hole 110, the protrusion 117 may have a laterally tapered shape from the lower sidewall of the floating gate 116a.

A photoresist pattern 120 is formed on the substrate 100 to cover the floating gate 116a and a portion of the control gate conductive layer 108. The photoresist pattern 120 linearly crosses over the first active region 102. A pair of photoresist patterns 120 are formed on the substrate 100 side by side. The second active region 104 is disposed between the pair of the photoresist patterns 120.

Figure 9A:
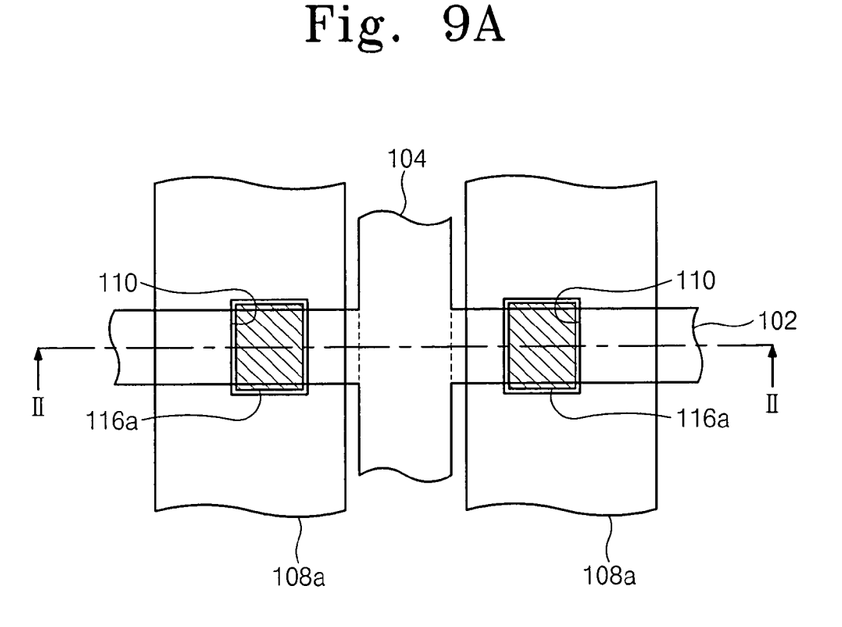
Figure 9B:
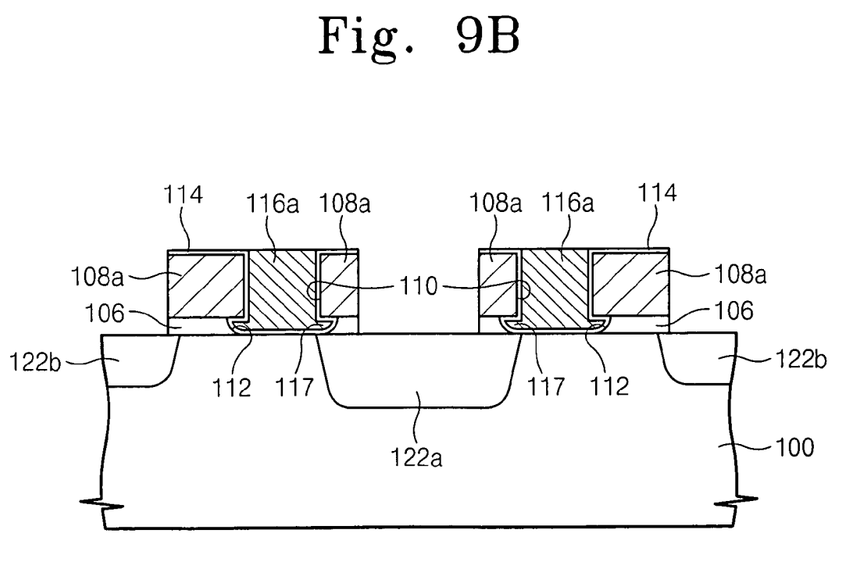

Referring to FIG. 9A and FIG. 9B, using the photoresist pattern 120 as an etch mask, the second insulation layer 114, the control gate conductive layer 108, and the first insulation layer 106 are anisotropically etched successively to form a control gate electrode 108a crossing over the first active region 102. The hole 110 and the floating gate 116a are disposed on the control gate electrode 108a. A top surface of the floating gate 116a is nearly as tall as an upper portion of the control gate electrode 108a. More specifically, the floating gate 116a is as tall as a top surface of the second insulation layer 114 formed on a top surface of the control gate electrode 108a.

Impurities are selectively implanted to form a first impurity doping layer 122a and a second impurity doping layer 122b at the first active region 102 between the control gate electrodes 108a. The first insulation layer 106 may remain on the active regions 102 and 104 adjacent to opposite sides of the control gate electrode 108a to act as a buffer for ion implantation before implantation of the impurities.

The first impurity doping layer 122a is formed on the first active region 102 between the pair of the control gate electrodes 108a. The first impurity doping layer 122a may be formed to extend along the second active region 104. The first impurity doping layer 122a formed on the first and the second active regions 102 and 104 may act as a source line. In a case where the second active region 104 is omitted, the first impurity doping layer 122a may be electrically connected to an overlying source line (not shown). The second impurity doping layer 122b is formed at the first active region 102 adjacent to one side of the control gate electrode 108a that is opposite to the first impurity doping layer 122a. The floating gate 116a is adjacent to the first impurity doping layer 122a. A portion of the floating gate 116a may overlap a portion of the first impurity doping layer 122a. The floating gate 116a is spaced apart from the second impurity doping layer 122b.

The first and the second impurity doping layers 122a and 122b may be sequentially formed using additional mask patterns. Thus, the first and the second impurity doping layers 122a and 122b may have different junction depths, as illustrated. Particularly, a junction of the first impurity doping layer 122a to which a high program voltage is applied may be deeper than that of the second impurity doping layer 122b. Alternatively, the first and the second impurity doping layers 122a and 122b may be formed at the same time. In this case, they have the same junction depth.

Figure 10A:
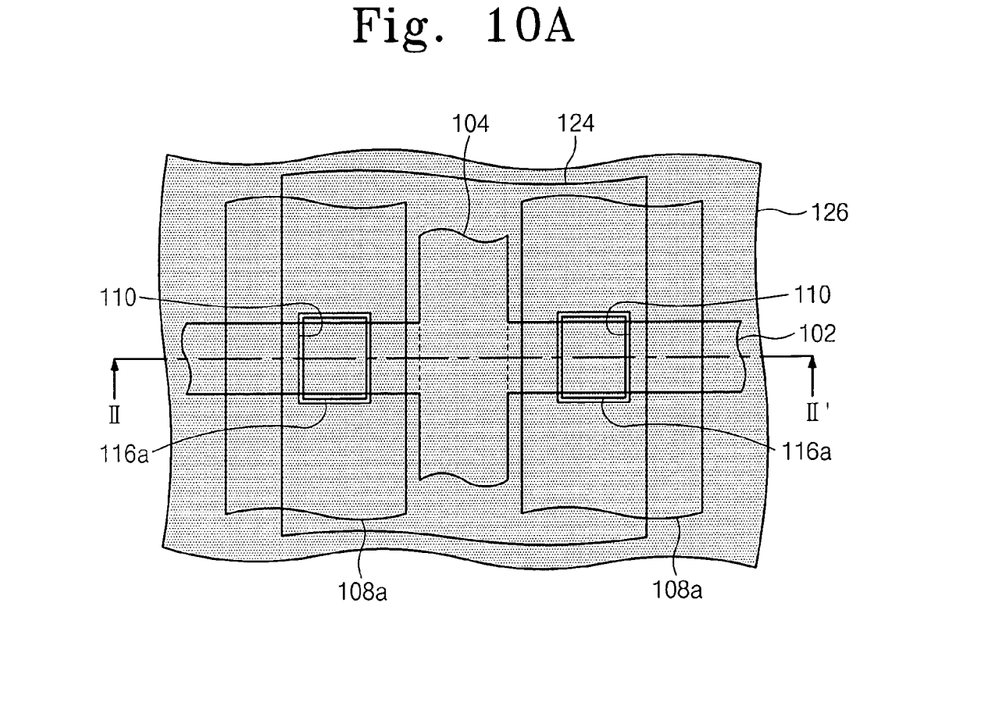
Figure 10B:
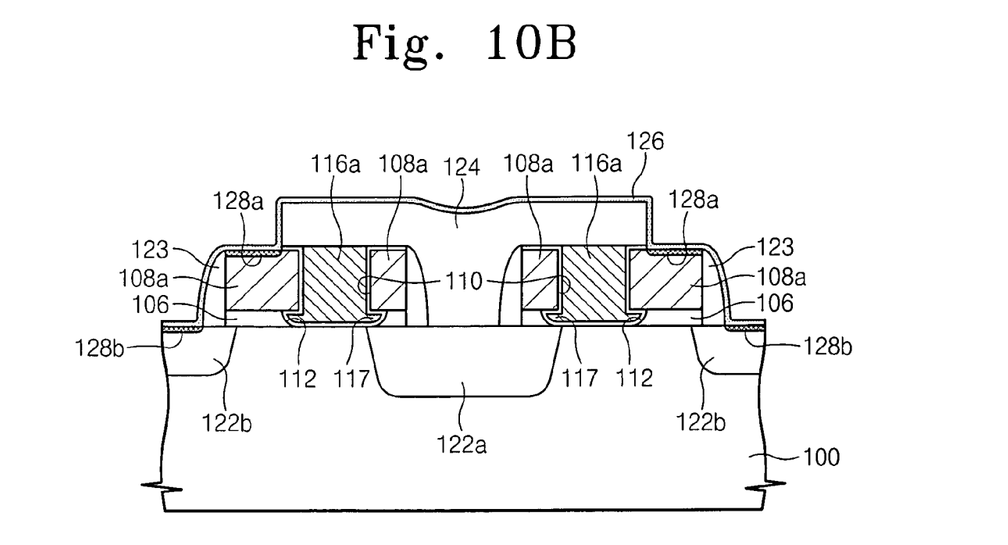

Referring to FIG. 10A and FIG. 10B, a spacer 123 is formed on sidewalls of the control gate electrode 108a. The spacer 123 is made of an insulator. For example, the spacer 123 may include silicon nitride or silicon oxide/silicon nitride.

Although not shown, following formation of the spacer 123, impurities are additionally implanted so that the impurity doping layers 122a and 122b have an LDD structure or an extended source/drain structure.

A silicidation barrier layer is formed on an entire surface of the substrate 100. The silicidation barrier layer is patterned to form a silicidation barrier pattern 124 covering a portion of a top surface of the control gate electrode 108a and a top surface of the floating gate 116a. The silicidation barrier pattern 124 may cover the first impurity doping layer 122a. As illustrated, the silicidation barrier pattern 124 may simultaneously cover the first impurity doping layer 122a, a portion of a top surface of the respective control gate electrodes 108a adjacent to opposite sides of the first impurity doping layer 122a, and top surfaces of the floating gates 116a. Thus, the portion of the top surface of the control gate electrode 108a and the second impurity doping layer 122b are exposed.

A metal layer 126 is deposited on an entire surface of the substrate 100. A silicidation process is carried out to form metal suicides 128a and 128b. A first metal silicide 128a is formed on a top surface of the control gate electrode 108a contacting the metal layer 126, and a second metal silicide 128b is formed on a surface of the second impurity doping layer 122b contacting the metal layer 126. Since the metal layer 126 may be made of cobalt, nickel or titanium, the metal silicides 128a and 128b are made of cobalt silicide, nickel silicide or titanium silicide. The process for depositing the metal layer 126 and the silicidation process may be performed in-situ.

Although not shown, in a case where the second metal silicide 128b is not required, the silicidation barrier pattern 124 may be formed to further cover the second impurity doping layer 122b, to selectively form the metal silicides 128a and 128b.

The unreacting metal layer 126 is removed to construct a non-volatile memory device shown in FIGS. 4A and 4B.

A method according to at least one embodiment of the invention does not include a conventional process for forming a thermal oxide layer for the peak of a floating gate. The floating gate 116a is formed in the hole 110 penetrating the control gate electrode 108a to prevent the adjacent floating gates 116a from being connected by a thermal oxide layer.

Following formation of the control gate conductive layer 108, the floating gate 116a is formed in the hole 110 penetrating the control gate conductive layer 108 to prevent generation of a step difference resulting from the floating gate 116a. Thus, when an etch is performed to form the control gate electrode 108, an entire area of the control gate conductive layer 108a may have a regular etch thickness. As a result, damage that may occur on a conventional substrate surface is suppressed and leakage current is prevented.

Additionally, the undercut region 112 is formed to form a protrusion 117 of the floating gate 116a. An electric field is concentrated on the protrusion 117 to reduce an erase voltage for discharging the charges of the floating gate 116a to the control gate electrode 108a. Thus, a non-volatile memory device of low power consumption may be realized.

Having described the exemplary embodiments of the present invention, it is further noted that it is readily apparent to those of reasonable skill in the art that various modifications may be made without departing from the spirit and the scope of the invention which is defined by the metes and bounds of the appended claims.

What is claimed is:

1. A non-volatile memory device comprising:
   a control gate electrode disposed on a substrate with a first insulation layer interposed therebetween;
   a floating gate disposed in a hole exposing the substrate through the control gate electrode and the first insulation layer; and
   a second insulation layer interposed between the floating gate and the substrate and between the floating gate and the control gate.

2. The non-volatile memory device of claim 1, wherein the floating gate has a protrusion filling an undercut region formed at a lower sidewall of the hole consisting of the first insulation layer.

3. The non-volatile memory device of claim 2, wherein the protrusion of the floating gate laterally tapers from a lower sidewall of the floating gate.

4. The non-volatile memory device of claim 1, wherein the second insulation layer is thinner than the first insulation layer.

5. The non-volatile memory device of claim 1, wherein the control gate electrode is made of silicon.

6. The non-volatile memory device of claim 5, wherein the second insulation layer is made of thermal oxide.

7. The non-volatile memory device of claim 1, further comprising:
   a first impurity doping layer formed on the substrate adjacent to one side of the control gate electrode; and
   a second impurity doping layer formed on the substrate adjacent to the other side of the control gate electrode, the second impurity doping layer being opposite to the first impurity doping layer,
   wherein the floating gate is adjacent to the first impurity doping layer and is spaced apart from the second impurity doping layer.

8. The non-volatile memory device of claim 1, further comprising:
   a metal silicide formed on a portion of a top surface of the control gate electrode.

9. A method of fabricating a non-volatile memory device, comprising:
   sequentially forming a first insulation layer and a control gate conductive layer on a substrate;
   forming a hole to expose a predetermined region of the substrate through the control gate conductive layer and the first insulation layer;
   forming a floating gate with a second insulation layer interposed therebetween to fill the hole; and
   patterning the control gate conductive layer to form a control gate electrode including the floating gate.

10. The method of claim 9, further comprising
    forming an undercut region at a lower sidewall of the hole consisting of the first insulation layer,
    wherein the floating gate has a protrusion filling the undercut region.

11. The method of claim 10, wherein the protrusion of the floating gate is formed to laterally taper from a lower sidewall of the floating gate.

12. The method of claim 11, wherein the forming the hole and the undercut region comprises:
    patterning the control gate conductive layer to expose a predetermined region of the first insulation layer; and
    isotropically etching the exposed first insulation layer to form the hole and the undercut region.

13. The method of claim 9, wherein the second insulation layer is formed to be thinner than the first insulation layer.

14. The method of claim 9, wherein the forming the floating gate comprises:
    forming a second insulation layer on an entire surface of a substrate having the hole;
    forming a gate layer on an entire surface of the substrate including the inside of the hole; and
    planarizing the gate layer down to a top surface of the second insulation layer on the control gate conductive layer to form the floating gate.

15. The method of claim 14, wherein the planarizing of the gate layer is accomplished by using one of etchback or chemical mechanical polishing (CMP).

16. The method of claim 9, wherein the control gate conductive layer is made of silicon.

17. The method of claim 16, wherein the second insulation layer is made of thermal oxide.

18. The method of claim 9, further comprising:
    forming a first impurity doping layer on the substrate adjacent to one side of the control gate electrode; and
    forming a second impurity doping layer on a substrate adjacent to the other side of the control gate electrode, the second impurity doping layer being opposite to the first impurity doping layer,
    wherein the floating gate is adjacent to the first impurity doping layer and is spaced apart from the second impurity doping layer.

19. The method of claim 18, further comprising:
    forming a silicidation barrier layer on the surface of the substrate; and
    patterning said silicidation barrier layer to form a silicidation barrier pattern covering the first impurity doping layer, a portion of a top surface of the control gate electrode and a top surface of the floating gate.

20. The method of claim 9, further comprising:
    selectively forming metal silicide on a portion of a top surface of the control gate electrode.

* * * * *